United States Patent
Cox et al.

(10) Patent No.: US 10,295,707 B2
(45) Date of Patent: May 21, 2019

(54) DURABILITY COATING FOR OXIDE FILMS FOR METAL FLUORIDE OPTICS

(71) Applicant: Corning Incorporated, Corning, NY (US)

(72) Inventors: Gerald Philip Cox, Brockport, NY (US); Michael Joseph D'Iallo, Spencerport, NY (US); Jean-Francois Oudard, Webster, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 460 days.

(21) Appl. No.: 14/623,993

(22) Filed: Feb. 17, 2015

(65) Prior Publication Data

US 2015/0241605 A1 Aug. 27, 2015

Related U.S. Application Data (60) Provisional application No. 61/945,150, filed on Feb. 27, 2014.

(51) Int. Cl.
*G02B 1/14* (2015.01)
*C09D 1/00* (2006.01)
(Continued)

(52) U.S. Cl.
CPC ............... *G02B 1/14* (2015.01); *C04B 41/00* (2013.01); *C09D 1/00* (2013.01); *C23C 14/024* (2013.01); *C23C 14/0694* (2013.01); *C23C 14/22* (2013.01); *C30B 25/00* (2013.01); *G02B 1/115* (2013.01); *Y10T 428/265* (2015.01)

(58) Field of Classification Search
CPC ........... G02B 1/14; G02B 1/115; C04B 41/00; C09D 1/00; C23C 14/024; C23C 14/0694; C23C 14/22; C30B 25/00; Y10T 428/265

See application file for complete search history.

(56) References Cited

U.S. PATENT DOCUMENTS 5,846,649 A 12/1998 Knapp et al.
7,128,984 B2 10/2006 Maier et al.
(Continued)

FOREIGN PATENT DOCUMENTS

DE 3942990 6/1991
JP 2010072451 A 4/2010
(Continued)

OTHER PUBLICATIONS

International Search Report, dated May 28, 2015 in connection with corresponding PCT Application No. PCT/US2015/017199 having an International Filing Date of Feb. 24, 2015.
(Continued)

*Primary Examiner* — Jonathan C Langman
(74) *Attorney, Agent, or Firm* — Kevin L. Bray (57) ABSTRACT

A coated metal fluoride optic is provided. The coated metal fluoride optic includes an alkaline earth metal fluoride substrate and a coating disposed on at least one surface of the substrate. The coating includes an adhesion layer comprising a fluoride-containing material, a non-densified intermediate layer deposited on the adhesion layer, and a densified capping layer deposited on the intermediate layer.

13 Claims, 7 Drawing Sheets

(51) Int. Cl.
  *G02B 1/115* (2015.01)
  *C04B 41/00* (2006.01)
  *C23C 14/02* (2006.01)
  *C23C 14/06* (2006.01)
  *C23C 14/22* (2006.01)
  *C30B 25/00* (2006.01)

(56) References Cited

U.S. PATENT DOCUMENTS

| | | | |
|---|---|---|---|
| 7,242,843 B2* | 7/2007 | Clar | G03F 7/70825 355/1 |
| 7,465,681 B2 | 12/2008 | Hart et al. | |
| 7,961,383 B2* | 6/2011 | Wang | G02B 5/0833 359/359 |
| 8,062,956 B2 | 11/2011 | Couillard | |
| 8,399,110 B2 | 3/2013 | Cangemi et al. | |
| 2003/0218798 A1 | 11/2003 | Kanazawa et al. | |
| 2008/0261053 A1 | 10/2008 | Arndt et al. | |
| 2009/0297812 A1* | 12/2009 | Cangemi | C23C 14/022 428/220 |
| 2012/0319048 A1* | 12/2012 | Cole | G02B 1/02 252/301.4 H |

FOREIGN PATENT DOCUMENTS

| | | |
|---|---|---|
| WO | 2009070227 | 6/2009 |
| WO | 2013071255 | 5/2013 |
| WO | 2013181175 | 12/2013 |

OTHER PUBLICATIONS

Shunsuke Niisaka and Yoshinori Watanabe "Laser durability improvement of deep UV fluoride coatings", Proc. SPIE, vol. 7132, Laser-Induced Damage in optical Materials: 2008, 71320H-1-71320H-9
EP15710977.8 Examination Report dated Jul. 11, 2018, European Patent Office, 5 pgs.
English Translation of JP2016553631 Office Action dated October 24, 2018; 3 pages; Japanese Patent Office.

* cited by examiner

DURABILITY COATING FOR OXIDE FILMS FOR METAL FLUORIDE OPTICS

This application claims the benefit of priority under 35 U.S.C. § 119 of U.S. Provisional Application Ser. No. 61/945,150 filed on Feb. 27, 2014 the content of which is relied upon and incorporated herein by reference in its entirety.

FIELD

The present disclosure is directed to durable metal oxide films. In particular, the present disclosure is directed to metal oxide films having improved adhesion and reduced film stress when deposited on metal fluoride optics, and to a method for making such films.

BACKGROUND

Metal fluoride optics, such as calcium fluoride optics, frequently include a coating deposited on the surface of the optic. The coating serves as a protective layer that prevents fluorine loss that occurs when the optic is exposed to radiation in high fluence laser applications. The fluorine loss causes degradation of the optic which ultimately leads to the failure of the optic and the need to replace the failed optic.

During manufacture of the coated optics, and after they are used, the coated optics are frequently cleaned using a solvent wipe such as, for example, a methanol wipe. Wiping is a mechanical technique for removing particulate matter from the surface of the coating. However, removal of particulate matter using such technique causes particles to be dragged across the surface of the coating, which can damage the coating. The use of a solvent wipe to clean coated optics has been observed to cause blistering, crazing and delamination of the coating. As used herein, the term "blistering" refers to dome shaped projections in the coating and local losses of adhesion of the coating which causes lifting of the coating from the underlying optic surface. Additionally, as used herein, the term "crazing" refers to cracks that penetrate into the coating. Also as used herein, the term "delamination" refers to loss of adhesion of the coating to the underlying optic surface, or to loss of adhesion between coating layers in coatings that include more than one layer.

Once damage such as blistering, crazing and/or delamination occurs, the coating's performance as a protective layer is reduced, and the adhesion of the coating to the surface of the optic is weakened. As a result, when the coating is damaged, fluorine loss in the optic, which the coating is meant to prevent, is observed during exposure to radiation in high fluence laser applications, and accelerated failure of the optic occurs.

SUMMARY

According to an embodiment of the present disclosure, a coated metal fluoride optic is provided. The coated metal fluoride optic includes an alkaline earth metal fluoride substrate and a coating disposed on at least one surface of the substrate. The coating includes an adhesion layer comprising a fluoride-containing material, a non-densified intermediate layer deposited on the adhesion layer, and a densified capping layer deposited on the intermediate layer.

According to another embodiment of the present disclosure, method for forming a coated metal fluoride optic is provided. The method includes depositing an adhesion layer comprising a fluoride-containing material onto at least one face of an alkaline earth metal fluoride substrate. The method further includes depositing an intermediate layer onto the adhesion layer without plasma ion assistance, and depositing a capping layer onto the intermediate layer with plasma ion assistance.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

The disclosure will be understood more clearly from the following description and from the accompanying figures, given purely by way of non-limiting example, in which.

DETAILED DESCRIPTION

Reference will now be made in detail to the present embodiment(s), an example(s) of which is/are illustrated in the accompanying drawings. Whenever possible, the same reference numerals will be used throughout the drawings to refer to the same or like parts.

The singular forms "a," "an" and "the" include plural referents unless the context clearly dictates otherwise. The endpoints of all ranges reciting the same characteristic are independently combinable and inclusive of the recited endpoint. All references are incorporated herein by reference.

Embodiments of the present disclosure provide a coating for a calcium fluoride optic that may be used in applications such as, but without limitation, lenses, partially and fully reflective mirrors, and windows in high power, high repetition rate, laser systems.

Figure 1:
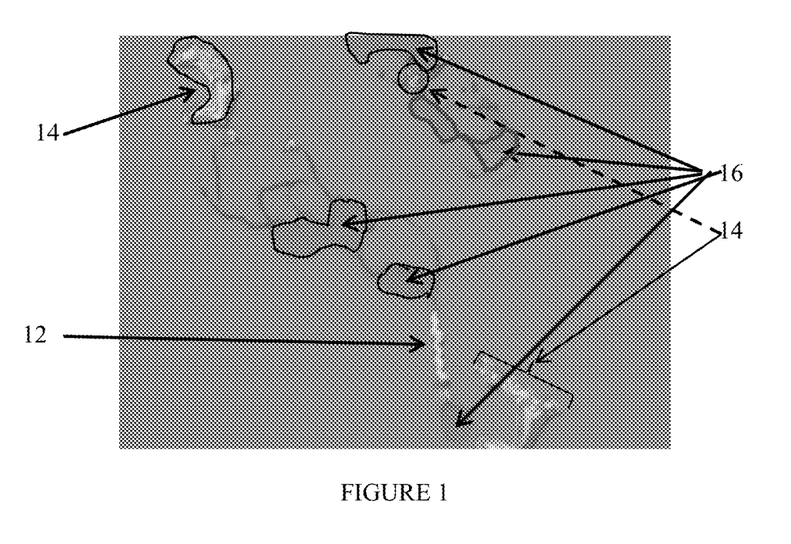
FIG. 1 is an image of a coated calcium fluoride optic showing blistering, crazing and delamination of the coating.
Figure 2A:
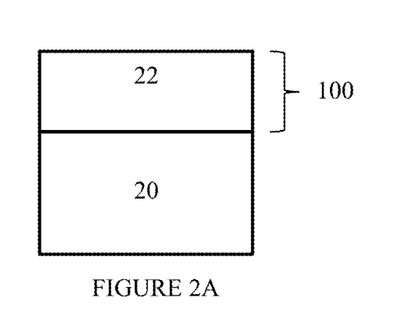
FIG. 2A illustrates a metal fluoride optic having a conventional coating.

FIG. 1 is an image of a coated calcium fluoride optic showing areas of crazing 12, areas of blistering 14 and areas of delamination 16. FIG. 2A illustrates a metal fluoride optic 20 having a conventional coating 100 which is similar to the coated metal fluoride of FIG. 1. As shown, deposited on a metal fluoride optic 20 is a coating 100 having a capping layer 22, wherein the capping layer 22 may be, without limitation, silicon dioxide ($SiO_2$) or F-doped silicon dioxide (F—$SiO_2$). Metal fluorides, such as calcium fluoride, are crystalline materials. In contrast, materials used for metal fluoride coatings, such as silicon oxide, are amorphous materials. The two types of materials have different coefficients of thermal expansion (CTE). For example, calcium fluoride has a CTE of about $18 \times 10^{-6}$/K and silicon dioxide has a CTE of about $0.5 \times 10^{-6}$/K. This difference in CTE of the two types of materials induces a compressive stress in the coating after the deposited coating is cooled from deposition temperatures to ambient temperatures. Without wishing to be limited by any particular theory, it is believed that this compressive stress causes blistering, crazing and delamination of the coating from the underlying optic such as is shown in FIG. 1.

Figure 2B:
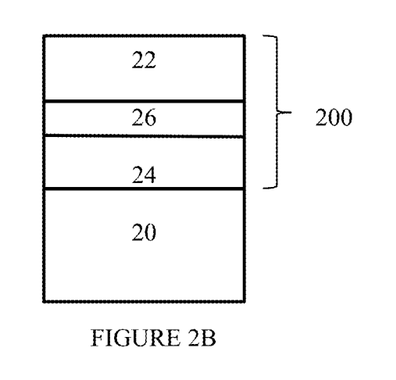
FIG. 2B illustrates a metal fluoride optic having a coating in accordance with the present disclosure.

FIG. 2B illustrates a metal fluoride optic 20 having a coating 200 disposed on at least one surface of the optic 20 in accordance with the present disclosure. As shown, the coating 200 includes an adhesion layer 24 deposited on the surface of the metal fluoride optic 20, an intermediate layer 26 deposited on the adhesion layer 24, and a capping layer 22 deposited on the intermediate layer 26. The metal fluoride optic 20 may be made from single crystals of alkaline earth metal fluorides such as, but without limitation, $MgF_2$, $CaF_2$, $BaF_2$ and $SrF_2$, and mixtures thereof. The metal fluoride optic 20 may be made from, for example, single crystals of $CaF_2$ doped with between about 12 ppm and about 2500 ppm $MgF_2$.

The adhesion layer 24 may be a fluoride-containing material having a CTE that is less than the CTE of the metal fluoride material of the metal fluoride optic 20 and that is greater than the CTE of the material of the capping layer 22. The CTE of the fluoride-containing material of the adhesion layer 24 may be for example, but without limitation, between about $3.0 \times 10^{-6}$/K and about $12 \times 10^{-6}$/K, or about $5.0 \times 10^{-6}$/K. The fluoride-containing material of the adhesion layer 24 may also have a low refractive index, for example, but without limitation, a refractive index of less than about 1.45, or even less than about 1.40. The fluoride-containing material may be for example, but without limitation, $AlF_3$, $Na_3AlF_6$, and $MgF_2$. The adhesion layer 24 may have a thickness of about 5.0 nm to about 70 nm. Alternatively, the thickness of the adhesion layer 24 may be between about 7.0 nm and about 50 nm.

The intermediate layer 26 is a non-densified layer deposited on the adhesion layer 24 without the use of plasma ion assistance. The intermediate layer 26 may be for example, but without limitation, $SiO_2$, F—$SiO_2$, $Al_2O_3$, F—$Al_2O_3$, SiON. The intermediate layer 26 may have a thickness of about 7.0 nm to about 20 nm. The capping layer 22 is a densified layer deposited on the intermediate layer 26. Similar to FIG. 2A, the capping layer 22 may be, without limitation, $SiO_2$ or F—$SiO_2$. The capping layer 22 may have a thickness of about 40 nm to about 80 nm.

Figure 3:
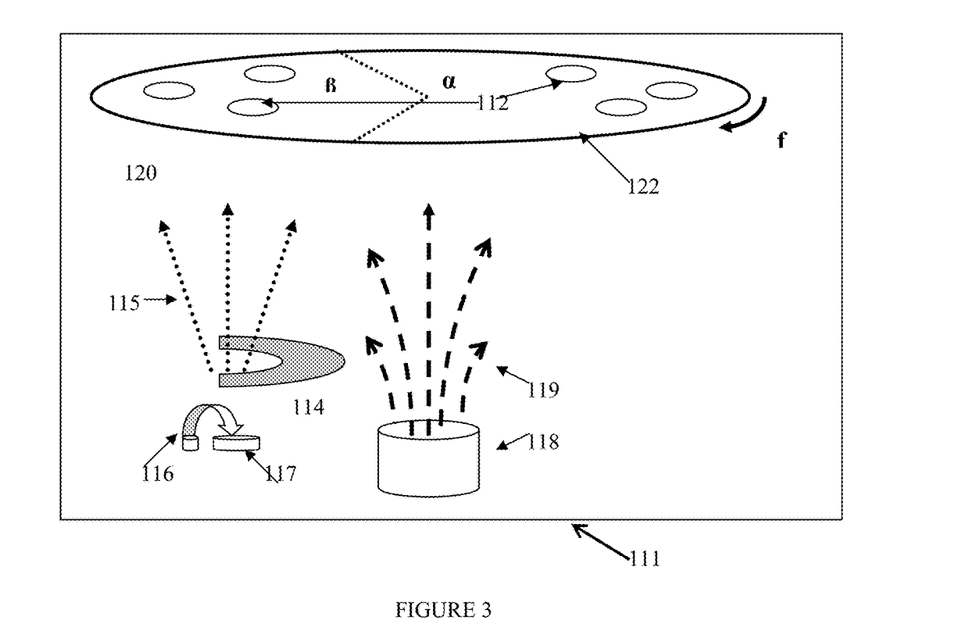
FIG. 3 illustrates an apparatus for coating a metal fluoride optic in accordance with the present disclosure.

A method for forming a coated metal fluoride optic in accordance with the present disclosure is provided herein. The method may be performed using an apparatus such as is described in U.S. Pat. Nos. 8,399,110 and 7,465,681, the specifications of which are incorporated by reference in their entirety. FIG. 3 illustrates a deposition system 120 having a vacuum chamber 111 in which is located a rotatable element holder 122 on which metal fluoride optics 112 to be coated are located. E-beam 116 that impinges on a target 117 to produce a vapor flux 115 that passes by the mask 114 for deposition on optics 112. The mask 114 may be a partial mask, as is shown in FIG. 3, or may be a reverse mask. In addition there is a plasma source 118 that generates plasma 119. The rotatable element holder 122 can have openings through the holder element for placements of optics 112 so that only one side of the optical element is to be coated.

In accordance with embodiments of the present disclosure, a fluoride-containing material having a low refractive index is deposited on at least one of the surfaces of the optics 112 in the vacuum chamber 111 to form an adhesion layer 24. To avoid fluoride depletion of the optics 112 and the adhesion layer 24, such deposition is performed without plasma ion assistance, i.e. plasma source plasma may be switched off during the deposition of the fluoride-containing material. A non-densified intermediate layer 26 is then deposited on the adhesion layer 24. Such deposition is also performed without plasma ion assistance. A densified capping layer 22 is then deposited on the intermediate layer 26. In contrast to the previous deposition steps, the capping layer 22 is formed with ion plasma assistance. The use of $Ar/O_2$ plasma ensures adhesion of the capping layer 22 to the underlying intermediate layer 26 and also densifies the capping layer 22. As is further shown in FIG. 3, the mask 114 forms zones α and β on the element holder 122. Use of the mask 114 limits deposition of the vapor flux 115 onto optics 112 in zone β. Similarly, where plasma ion assistance is utilized in the present method, only plasma ions reach the element holder 122 in zone α, whereas plasma ions interact with the vapor flux 115 in zone β. Deposition of the layers of the coating 200 as described herein may be performed at temperatures of between about 280° C. and about 350° C. The deposition temperatures may be between about 290° C. and about 325° C., or even between about 300° C. and about 320° C.

As will become clearer in view of the Examples disclosed herein, embodiments of the present disclosure improve the adhesion of the capping layer 22 and provide a more robust protective layer for the metal fluoride optic 20. Without wishing to be bound by any particular theory, it is believed that the inclusion of the fluoride-containing material of the adhesion layer 24 forms a fluoride-to-fluoride bond with the metal fluoride of the underlying optic 20. It is also believed that the inclusion of the intermediate layer 26 deposited without the use of plasma ion assistance improves the adhesion of the capping layer 22 and protects the adhesion layer 24 from degradation by plasma containing oxygen such as is used in plasma ion assisted deposition. Furthermore, it is believed that the adhesion layer 24 and the intermediate layer 26 act as a mechanical buffer between the capping layer 22 and the metal fluoride optic 20, with the stack of the adhesion layer 24, the intermediate layer 26 and the capping layer 22 being less dense than the capping layer 22 of the conventional metal fluoride optic of FIG. 2A. The less dense configuration is believed to provide a lower modulus of rupture that reduces propagation of damage in the coating. Additionally, the use of a fluoride-containing material having a CTE that is less than the CTE of the metal fluoride material of the metal fluoride optic 20 and that is greater than the CTE of the material of the capping layer 22 is believed to reduce the compressive stress in the after the deposited coating is cooled from deposition temperatures to ambient temperatures, and in turn is believed to reduce blistering, crazing and delamination of the coating from the underlying optic.

EXAMPLES

Embodiments of the present disclosure are further described below with respect to certain exemplary and specific embodiments thereof, which are illustrative only and not intended to be limiting.

Example 1

Five groups (S1 to S5) of coated metal fluoride optics were formed in accordance with the data in Table I. The material of the intermediate layer and the capping layer of each of the coated metal fluoride optics was F—$SiO_2$ and the thicknesses of the intermediate layer and the capping layer were the same for all of the coated metal fluoride optics. Where formed, the adhesion layer and the intermediate layer of each coated metal fluoride optic was deposited without plasma ion assistance, while the capping layer of each coated metal fluoride optic was deposited using plasma ion assistance. The material of the adhesion layer and the thickness of the adhesion layer were different for each of the five groups of coated metal fluoride optics. The optics of group S1 were formed with no adhesion layer; the optics of group S2 were formed with an adhesion layer of $AlF_3$ having a thickness of 10 nm; the optics of group S3 were formed with an adhesion layer of $AlF_3$ having a thickness of 30 nm; the optics of group S4 were formed with an adhesion layer of $MgF_2$ having a thickness of 10 nm; and the optics of group S5 were formed with an adhesion layer of $MgF_2$ having a thickness of 30 nm. The deposition temperature for all layers was about 305° C.

TABLE I

| OPTIC | ADHESION LAYER MATERIAL | ADHESION LAYER THICKNESS (nm) | INTERMEDIATE LAYER THICKNESS (nm) | CAPPING LAYER THICKNESS (nm) |
| --- | --- | --- | --- | --- |
| S1a | None | 0 | 10 | 52 |
| S1b | None | 0 | 10 | 52 |
| S2a | $AlF_3$ | 10 | 10 | 52 |
| S2b | $AlF_3$ | 10 | 10 | 52 |
| S3a | $AlF_3$ | 30 | 10 | 52 |
| S3b | $AlF_3$ | 30 | 10 | 52 |
| S4a | $MgF_2$ | 10 | 10 | 52 |
| S4b | $MgF_2$ | 10 | 10 | 52 |
| S5a | $MgF_2$ | 30 | 10 | 52 |
| S5b | $MgF_2$ | 30 | 10 | 52 |

Example 2

Five of the coated metal fluoride optics formed in Example 1 (S1a, S2a, S3a, S4a, and S5a) were cleaned using six cycles of a solvent wipe process. A cycle of the solvent wipe process included submerging the coated metal fluoride optic in deionized water and wiping the coated metal fluoride optic by hand for 5.0 seconds using a TX404 Absorbond™ Synthetic Wipe commercially available from ITW Texwipe, Kernersville, N.C. A cycle of the solvent wipe process also included drying the coated metal fluoride optic in a spin rinse dryer.

Figure 4:
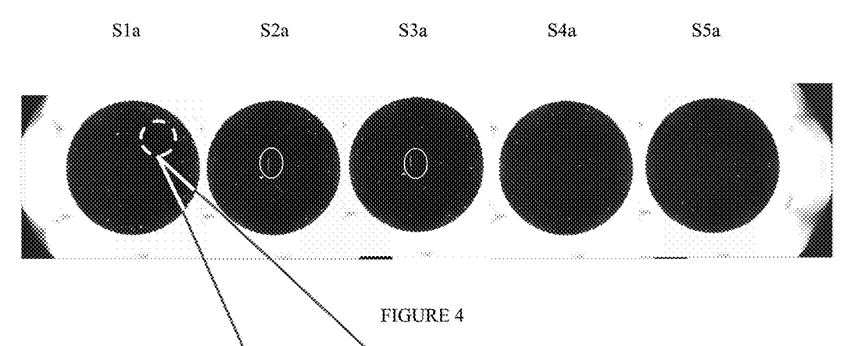
FIG. 4 shows high intensity scattered light images of five different coated metal fluoride optics (S1a, S2a, S3a, S4a, and S5a) in accordance with the present disclosure.
Figure 5:
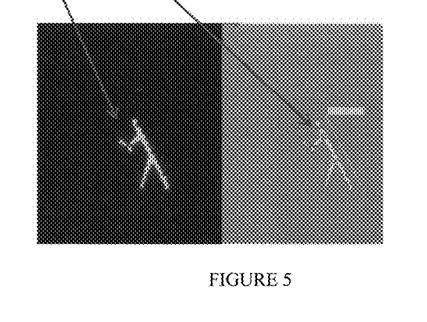
FIG. 5 is an image of areas of crazing of optic S1a of FIG. 3 captured using optical microscopy.

FIG. 4 shows high intensity scattered light images of the five coated metal fluoride optics (S1a, S2a, S3a, S4a, and S5a). The only differences observed in the images shown in FIG. 4 are the visible scratches (shown by circles in images of coated metal fluoride optics S2a and S3a), which are the result of the wiping process. However, no blistering, crazing or delamination of the layers of the coatings was observed in the images. To analyze the coatings in more detail, images of the optics were captured using optical microscopy. FIG. 5 shows the only instance of crazing that was observed for all of the five coated metal fluoride optics (S1a, S2a, S3a, S4a, and S5a). Crazing was observed on the coating of optic S1a, which was formed without an adhesion layer. Based on these results, the coatings of optics S2a to S5a, which included an adhesion layer, were determined to be more robust and better suited to withstand cleaning with a solvent wipe than coatings formed without an adhesion layer.

Example 3

Five of the coated metal fluoride optics formed in Example 1 (S1b, S2b, S3b, S4b, and S5b) were subjected to a micro-indentation process using an M1 Micro-indentation Tester commercially available from Nanovea, Inc., Irvine, Calif. In the micro-indentation process, an indenter tip was driven into the coated metal fluoride optics by applying an increasing load up to a targeted value. After the targeted load was reached, the load was gradually decreased and the optics were examined for damage to the coatings.

Figure 6:
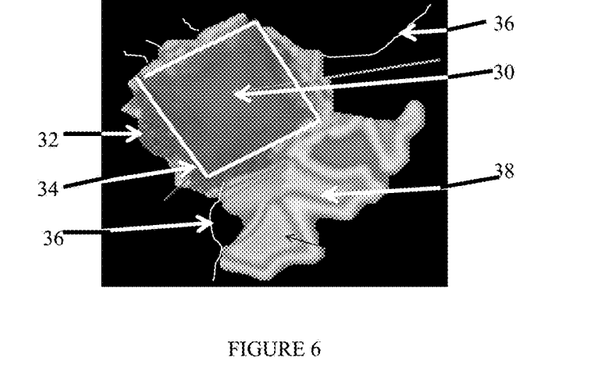
FIG. 6 is an image of a micro-indented optic.

FIG. 6 is an image of a micro-indented optic and the different damage types induced by the indentation process. The optic of FIG. 6 was formed in accordance with optics S1a and S1b. As shown in FIG. 6, area 30 is the area of the optic covered by the indenter, with box 34 indicating the edge of the indenter. Delamination 32 of the coating from the surface of the optic is seen as dark areas. Blistering 38 of the coating, where the coating did not remain adhered to the optic but remained intact with other portions of the coating, is seen in lighter areas of the image. Radial cracks 36, which are channels in the layers of the coating, can be seen propagating from the edge of the indent.

Figure 7:
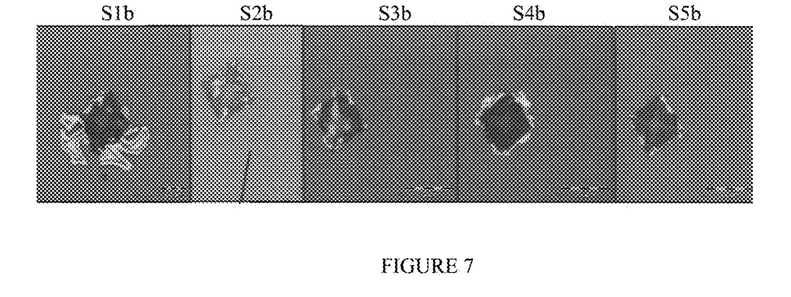
FIG. 7 shows a comparison of images of five different coated metal fluoride optics (S1b, S2b, S3b, S4b, and S5b) after micro-indentation testing.

FIG. 7 shows a comparison of images of the five different coated metal fluoride optics (S1b, S2b, S3b, S4b, and S5b) after micro-indentation testing. As shown, less damage is observed for the coatings of optics S2b to S5b than for the coating of optic S1b. Based on these results, the coatings of optics of S2b to S5b, which included an adhesion layer, were determined to be more robust and better suited to withstand damage than optics formed without an adhesion layer.

Example 4

Figure 8:
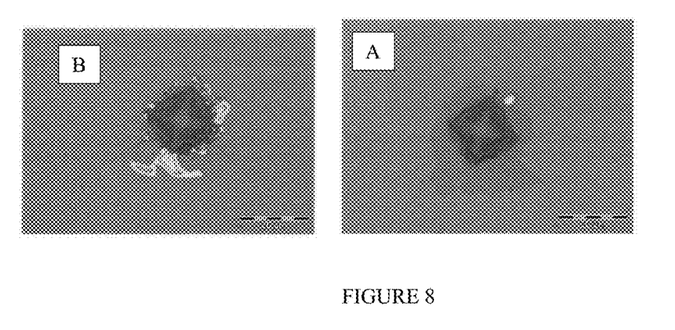
FIG. 8 shows a comparison of images of a micro-indented optic before (Image B of FIG. 8) and after (Image A of FIG. 8) cleaning with a solvent wipe, wherein the optic has a conventional coating.
Figure 9:
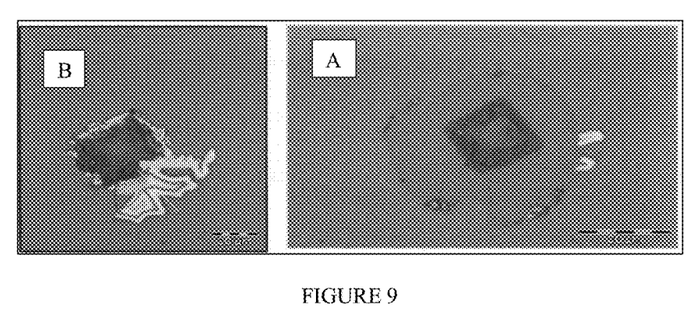
FIG. 9 shows a comparison of images of micro-indented optic S1b before (Image B of FIG. 9) and after (Image A of FIG. 9) cleaning with a solvent wipe.
Figure 10:
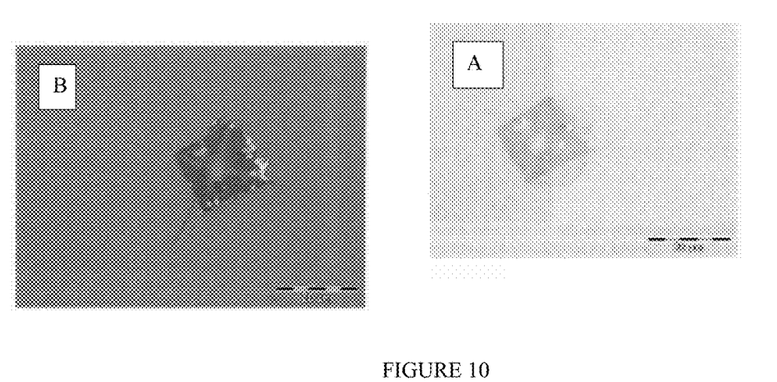
FIG. 10 shows a comparison of images of micro-indented optic S2b before (Image B of FIG. 10) and after (Image A of FIG. 10) cleaning with a solvent wipe.
Figure 11:
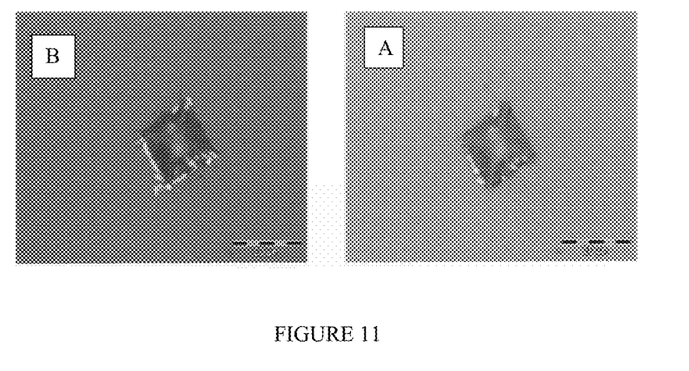
FIG. 11 shows a comparison of images of micro-indented optic S3b before (Image B of FIG. 11) and after (Image A of FIG. 11) cleaning with a solvent wipe.
Figure 12:
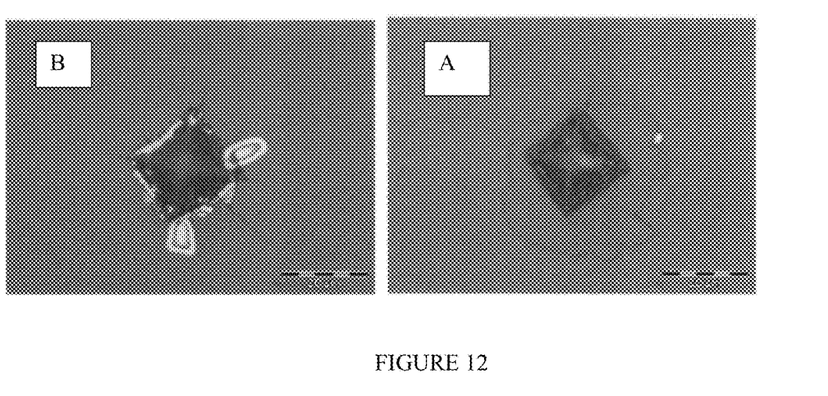
FIG. 12 shows a comparison of images of micro-indented optic S4b before (Image B of FIG. 12) and after (Image A of FIG. 12) cleaning with a solvent wipe.
Figure 13:
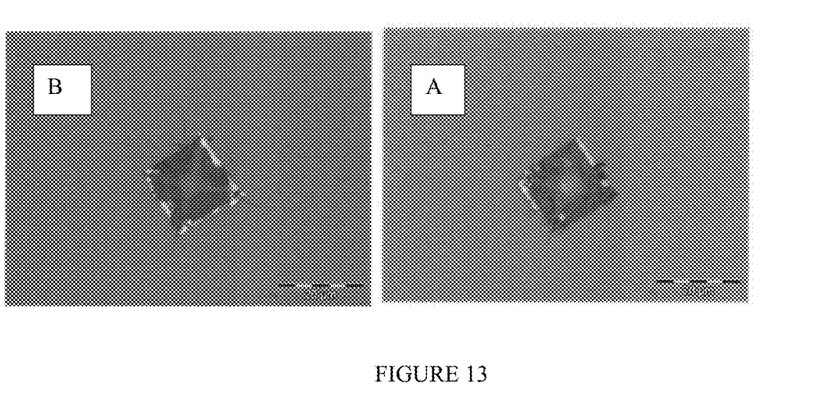
FIG. 13 shows a comparison of images of micro-indented optic S5b before (Image B of FIG. 13) and after (Image A of FIG. 13) cleaning with a solvent wipe.

The five coated metal fluoride optics micro-indented in Example 3 (S1b, S2b, S3b, S4b, and S5b) were cleaned using the solvent wipe process discussed in Example 2. In addition, for purposes of comparison, a micro-indented coated metal fluoride optic having only an F—SiO₂ capping layer, such as the coated metal fluoride optic shown in FIG. 2A, was cleaned using the solvent wipe process discussed in Example 2. FIG. 8 shows a comparison of images of a micro-indented optic before (Image B of FIG. 8) and after (Image A of FIG. 8) cleaning with a solvent wipe. The similarities of the images of FIG. 8 FIGS. 8A-8B to the images of FIG. 9, which show a comparison of images of micro-indented optic S1b before (Image B of FIG. 9) and after (Image B of FIG. 9) cleaning with a solvent wipe, indicates that optics S1a and S1b can be treated as reasonable representations of a metal fluoride optics having conventional coatings.

FIGS. 9-13 show comparisons of images of the micro-indented optics, S1b-S5b respectfully, before and after cleaning with a solvent wipe. As shown, less blistering, crazing and delamination was observed for the coatings of the optics S2b to S5b than for the coating of the optic S1b after cleaning with a solvent wipe. Based on these results, the coatings of optics S2b to S5b, which included an adhesion layer, were determined to be more robust and better suited to withstand damage, in particular delamination as a result of cleaning with a solvent wipe, than optics formed without an adhesion layer.

Example 5

Three coated metal fluoride optics were formed in accordance with the data in Table II. Coated optic 40 was formed in accordance with the coated metal fluoride optic shown in FIG. 2A, and coated optics 42 and 44 were formed in accordance with the coated metal fluoride optic shown in FIG. 2B. For each of the coated optics the capping layer included a densified F—SiO₂. For coated optics 42 and 44, the adhesion layer included AlF₃ and the intermediate layer included non-densified F—SiO₂. Coated optic 40 was formed without an adhesion layer or an intermediate layer.

TABLE II

| OPTIC | ADHESION LAYER THICKNESS (nm) | INTERMEDIATE LAYER THICKNESS (nm) | CAPPING LAYER THICKNESS (nm) |
|---|---|---|---|
| 40 | 0 | 0 | 52 |
| 42 | 10 | 10 | 52 |
| 44 | 30 | 10 | 52 |

Figure 14:
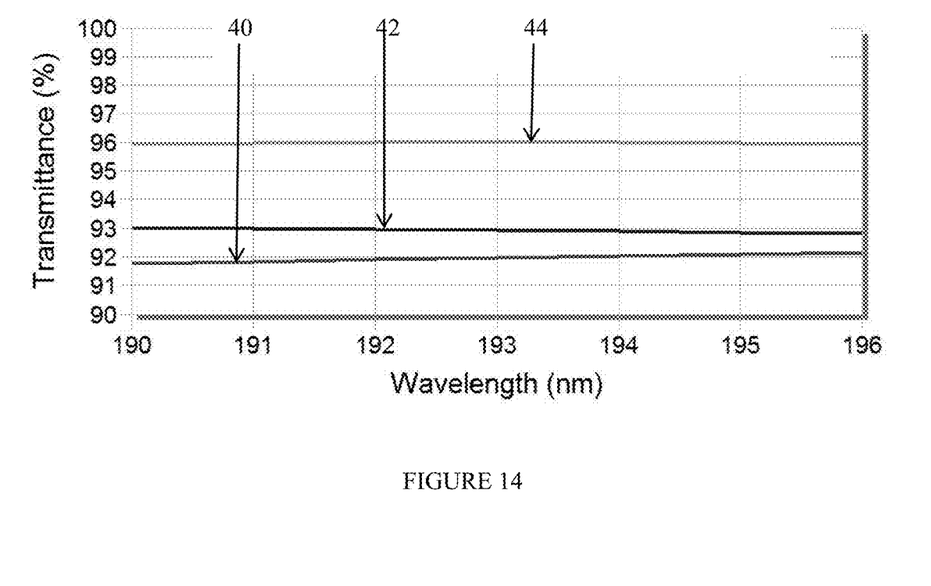
FIG. 14 is a graph showing % transmittance versus wavelength for coated metal fluoride optics in accordance with embodiments of the present disclosure.

Spectral transmittance of each of the coated optics 42-44 was measured and FIG. 14 is a graph showing % transmittance versus wavelength (nm) for the coated metal fluoride optics of Table II. As shown, coated optic 40 has a spectral transmittance of about 92% in the range of 190-196 nm, coated optic 42 has a spectral transmittance of about 93% in the range of 190-196 nm, and coated optic 44 has a spectral transmittance of about 96% in the range of 190-196 nm. It was determined that coatings including an adhesion layer in accordance with embodiments of the present disclosure provide improved transmittance over conventional coatings.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A coated metal fluoride optic comprising:
an alkaline earth metal fluoride substrate; and
a coating disposed on at least one surface of the substrate, the coating comprising:
an adhesion layer comprising a fluoride-containing material;
a non-densified intermediate layer deposited on the adhesion layer, the non-densified intermediate layer comprising a material selected from the group consisting of SiO₂, F—SiO₂, Al₂O₃, F—Al₂O₃, SiON; and
a densified capping layer deposited on the non-densified intermediate layer, the densified capping layer having the same composition as the non-densified intermediate layer, the densified capping layer differing in density from the non-densified intermediate layer.

2. The coated metal fluoride optic of claim 1, wherein the alkaline earth metal substrate is a single crystal alkaline earth metal fluoride substrate selected from the group consisting of MgF₂, CaF₂, BaF₂, SrF₂, and mixtures thereof.

3. The coated metal fluoride optic of claim 1, wherein the alkaline earth metal substrate comprises a single crystal CaF₂ substrate doped with between about 12 ppm and about 2500 ppm MgF₂.

4. The coated metal fluoride optic of claim 1, wherein the fluoride-containing material of the adhesion layer is selected from the group consisting of AlF₃, Na₃AlF₆, and MgF₂.

5. The coated metal fluoride optic of claim 1, wherein the fluoride-containing material of the adhesion layer has a refractive index of less than about 1.45.

6. The coated metal fluoride optic of claim 1, wherein the fluoride-containing material of the adhesion layer has a CTE in the range of about $3.0 \times 10^{-6}$/K and about $12 \times 10^{-6}$/K.

7. The coated metal fluoride optic of claim 1, wherein the adhesion layer has a thickness of between about 5.0 nm and about 70 nm.

8. The coated metal fluoride optic of claim 1, wherein the intermediate layer has a thickness of between about 7.0 nm and about 20 nm.

9. The coated metal fluoride optic of claim 1, wherein the capping layer comprises a material selected from the group consisting of SiO₂, F—SiO₂, Al₂O₃, F—Al₂O₃, SiON.

10. The coated metal fluoride optic of claim 1, wherein the capping layer has a thickness of between about 40 nm and about 70 nm.

11. The coated metal fluoride optic of claim 1, wherein the adhesion layer has a thickness of at least about 10 nm, and wherein transmission of 190-196 nm wavelength light through the metal fluoride optic is at least 93%.

12. The coated metal fluoride optic of claim 1, wherein the adhesion layer has a thickness of at least about 30 nm, and wherein transmission of 190-196 nm wavelength light through the metal fluoride optic is at least 96%.

13. The coated metal fluoride optic of claim 1, wherein the non-densified intermediate layer is in direct contact with the densified capping layer.

\* \* \* \* \*